(12) United States Patent
Calugaru

(10) Patent No.: US 11,004,783 B2
(45) Date of Patent: May 11, 2021

(54) INTEGRATED CIRCUIT CHIP DESIGN FOR SYMMETRIC POWER DELIVERY

(71) Applicant: Microsoft Technology Licensing, LLC, Redmond, WA (US)

(72) Inventor: Vlad Radu Calugaru, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 15 days.

(21) Appl. No.: 16/425,485

(22) Filed: May 29, 2019

(65) Prior Publication Data

US 2020/0381351 A1 Dec. 3, 2020

(51) Int. Cl.
*H01L 23/50* (2006.01)
*H01L 23/367* (2006.01)
*H05K 1/02* (2006.01)

(52) U.S. Cl.
CPC .......... *H01L 23/50* (2013.01); *H01L 23/3672* (2013.01); *H05K 1/0262* (2013.01)

(58) Field of Classification Search
CPC .... H01L 23/50; H01L 23/3672; H05K 1/0262
USPC ....................................................... 438/612
See application file for complete search history.

(56) References Cited

U.S. PATENT DOCUMENTS

| 7,235,880 | B2 | 6/2007 | Prokofiev |
| 9,666,549 | B2 | 5/2017 | Chiu et al. |
| 10,019,048 | B2 | 7/2018 | Chen |
| 10,056,327 | B2 | 8/2018 | Zhai et al. |
| 10,194,530 | B2 | 1/2019 | Chang et al. |
| 2005/0093120 | A1 | 5/2005 | Millik et al. |
| 2012/0112352 | A1 | 5/2012 | Chi et al. |
| 2013/0003310 | A1 | 1/2013 | Raj et al. |
| 2016/0181211 | A1 | 6/2016 | Kamgaing et al. |
| 2016/0218094 | A1 | 7/2016 | Bruno et al. |
| 2019/0006334 | A1 | 1/2019 | Gardner et al. |

OTHER PUBLICATIONS

Khan, et al., "Power Delivery Design for 3-D ICs Using Different Through-Silicon via (TSV) Technologies", In Journal of IEEE Transactions on Very Large-Scale Integration (VLSI) Systems, vol. 19, Issue 4, Mar. 11, 2010, pp. 647-658.
"International Search Report and Written Opinion Issued in PCT Application No. PCT/US2020/029171", dated Jun. 29, 2020, 12 Pages.

*Primary Examiner* — Elias Ullah
(74) *Attorney, Agent, or Firm* — Holzer Patel Drennan

(57) ABSTRACT

An integrated circuit (IC) chip design for symmetric power delivery includes an integrated circuit (IC) chip package with I/O connections exposed on a first surface and power connections exposed on a second opposite surface. At least one voltage regulation module (VRM) is positioned on the second opposite surface and electrically coupled to the power connections on the second opposite surface.

20 Claims, 5 Drawing Sheets

INTEGRATED CIRCUIT CHIP DESIGN FOR SYMMETRIC POWER DELIVERY

BACKGROUND

An integrated circuit (IC) chip, such as a system on chip (SoC) or application specific integrated circuit (ASIC), may support several different load-drawing on-chip electrical components such as one or more memory, computer processing units (CPUs), and graphics processing components (GPUs). When load-drawing on-chip components experience large load transients, impedance along a current path may cause a voltage received at a load-drawing component to "droop" relative to an expected value. This droop may increase in proportion to the physical separation between the voltage regulation module (VRM) and the load-drawing component.

Droop can be corrected for by detecting a reference voltage at a VRM controller and ramping up a voltage setpoint value until the reference voltage matches the load. However, this ramp-up takes time proportional to current path length, and device performance may be impacted if power rail voltage for a particular load-drawing component drops outside of the component's defined tolerance range. For this reason, decoupling capacitors are often utilized to temporarily boost power rail voltage responsive to line transients. However, decoupling capacitors are expensive and may be insufficient to guarantee line voltage within the tolerance ranges of some modern on-chip electrical components.

SUMMARY

An integrated circuit (IC) chip design for symmetric power delivery to various on-chip components includes an integrated circuit (IC) chip package with I/O connections exposed on a first surface and power connections exposed on a second opposite surface. At least one voltage regulation module (VRM) is positioned on the second opposite surface and electrically coupled to the power connections on the second opposite surface.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. These and various other features and advantages will be apparent from a reading of the following Detailed Description.

DETAILED DESCRIPTION

To ensure current supply does not drop outside of the individual tolerance ranges of each on-chip electrical component, modern IC chips may rely on localized decoupling capacitors to manage large load transients. For example, localized decoupling capacitors may be positioned along a power rail so as to discharge when a voltage drop occurs in order to keep voltage stable along the rail. This current discharge provides a temporary current surge along the line to a load-drawing component while a voltage controller takes action to ramp up the line voltage setpoint (e.g., using a reference line feedback) until the supply voltage is sufficient to alone support the increased load. However, decoupling capacitors are costly to implement. Further, as processors increase in power with advancements in technology, component tolerance margins tighten while at the same time introducing the potential for larger system load transients. This drives an increase in the corresponding size of decoupling capacitors needed to support load transients and thereby also drives demand for alternative solutions for faster power delivery between the VRM and individual processing nodes.

The herein disclosed technology provides an IC chip design that decreases physical separation between voltage regulation modules (VRMs) and on-chip load-drawing components. This decrease in physical separation improves the speed at which power is delivered to each load-drawing component on the IC chip, allowing an individual IC chip to more easily support large transient loads without the use of decoupling capacitors.

According to one implementation, the disclosed IC chip design includes input/output (I/O) connections on a first surface of an IC and power connections on a second opposite surface. One or more VRMs may be stacked on the second opposite surface of the chip and connected to the power connections. This arrangement reduces the length of sense lines and may also provide symmetric power delivery to all processing components receiving power from a same feed source, eliminating instances of voltage droop.

Figure 1:
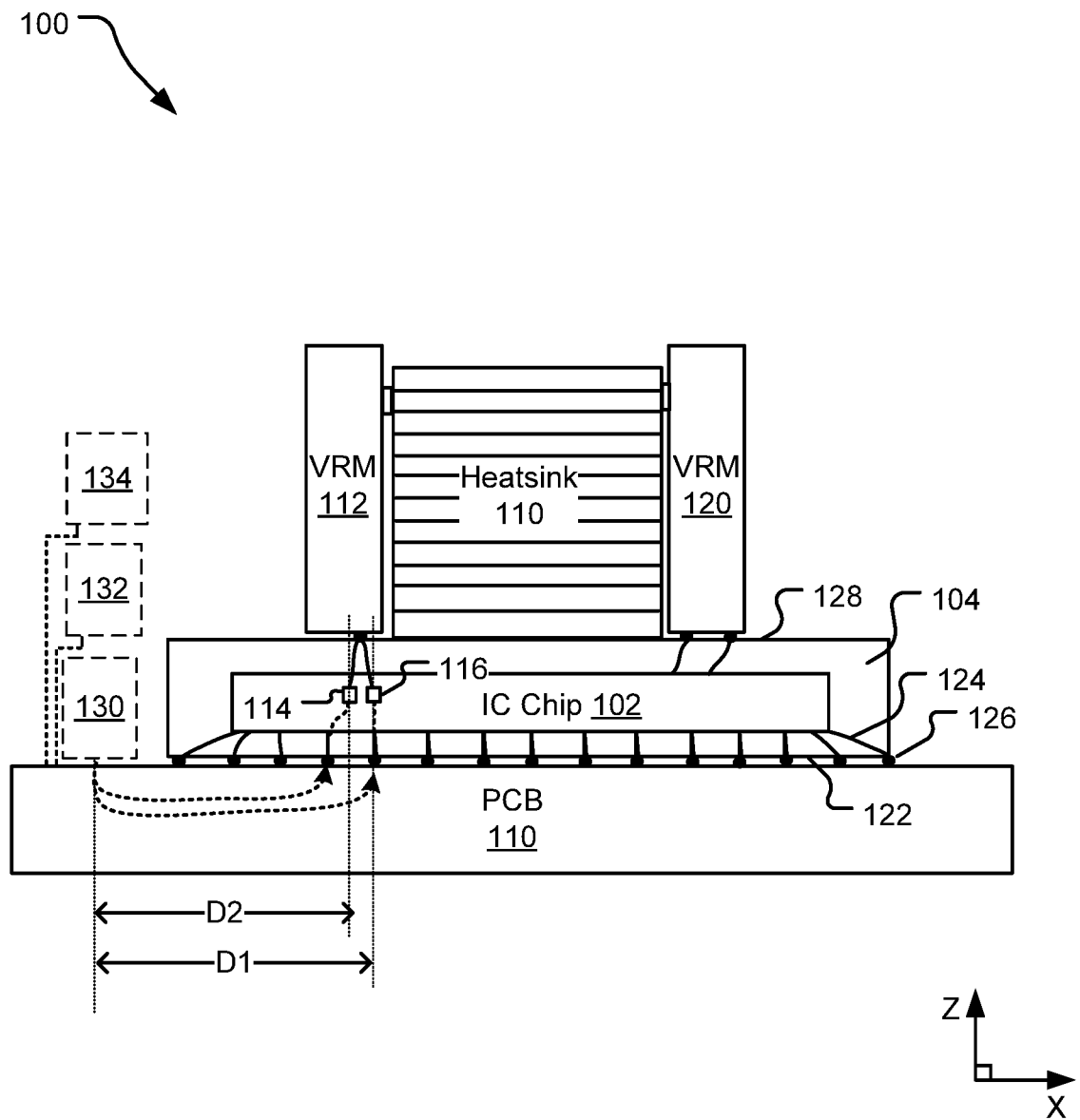
FIG. 1 illustrates a cross-sectional view of an integrated circuit (IC) assembly with features for symmetric power delivery to multiple load-drawing components on an IC chip.

FIG. 1 illustrates a cross-sectional view of an integrated circuit (IC) assembly 100 with features for symmetric power delivery to multiple on-chip load-drawing components (e.g., components 114, 116) on an IC chip 102. In various implementations, the IC chip 102 may be any type of processing chip including without limitation an SoC, ASIC, etc. The IC chip 102 supports various load-drawing components 114, 116, such as one or more memory, one or more CPUs, one or more GPUs, etc.

The IC chip 102 is encased in a chip package 104 that includes traces (e.g., a trace 124) to connect each of leads of the on-chip load-drawing components 114, 116 to solder balls (e.g., a solder ball 126) on a ball grid array (BGA). In traditional systems, a BGA is included on a single surface of the chip package 104, such as a downward-facing surface 122 that is, in FIG. 1, shown to face a PCB 110. In the IC assembly 100, solder balls are included on an upward-facing surface 128 of the chip package 104 as well as the downward-facing surface 122. Consequently, the various electrical components of the IC chip 102 are each exposed via a solder ball connection on one of the downward-facing surface 122 or the upward-facing surface 128.

The IC chip 102 receives power from one or more voltage regulator module blocks (e.g., VRM blocks 112, 114). As used herein, the term VRM block is used broadly to refer to a voltage board that includes one or more VRMs outputting voltage to at least one subsystem voltage rail, such as a voltage rail for memory, a CPU, or a GPU. For example, a VRM block includes one or more circuits for regulating and down-stepping voltage from a system power rail to the subsystem power rail of an on-chip load-drawing component (e.g., 114, 116). In one example implementation, a VRM block includes a VRM that converts a power rail voltage (e.g., 12/5/3.3 V) that comes with a power supply unit (not shown) to a much lower operating voltage of an on-chip memory or processing component (e.g., 0.8V, 1V, 1.2 V).

In one implementation, one or more of the VRM blocks 112 and 120 includes circuitry to support a multi-phase VRM, where each phase supplies a fraction of power to the power rail of one of the on-chip load-drawing components 114, 116. In a multi-phase VRM, different phases take turns to provide power to a voltage rail and the burst of power from each phase is time-staggered relative to the last so that the total amount of power received at a load-drawing component remains constant. Per the above definition, the VRM block 112 may, for example, include a VRM including all phases to support a CPU while the VRM block 120 includes a VRM including all phases to support a GPU.

In some implementations, a VRM block may include VRMs to support more than one subsystem power rail. For example, the VRM block 112 may include a first VRM to provide all phases of power to a CPU voltage rail and a second VRM to provide all phases of power to a GPU voltage rail, while the VRM block 120 includes the circuitry to provide all phases of power to one or more memory rails. In still other implementations, other converters may be included on the VRMs along with the circuitry to support the voltage rail(s) of one or more of the aforementioned load-drawing components.

Although the cross-sectional view of FIG. 1 illustrates two VRM blocks 112 and 120 stacked on top of the chip package 104, the IC assembly 100 may—in other implementations—include a single VRM block or more than two VRM blocks. A heat sink is positioned adjacent to the two VRM blocks 112, 120 (e.g., between the VRMs) to draw heat away from the IC chip 102 during operation. In various implementations, the heat sink 110 may assume a variety of different forms including without limitation, a vapor chamber heat sink or hybrid version, a heat pipe, solid base, fin and fan etc.

In some traditional systems, the VRM block(s) are offset from the chip package 104 in the X-Y plane. For example, VRMs from of each of the different VRM blocks 120, 122 may, in a traditional system, be offset from the IC ship 102 and stacked along a Z-axis, such as in the exemplary positions shown by positions 130, 132, and 134. In these systems, current in-route to processing components on the IC chip 102 flows down from each VRM block (e.g., in a direction parallel to the z-axis) toward the PCB 110, laterally along the PCB 110, up through the balls of the BGA, and through the traces in the chip package 104 to the leads of the processing components (e.g., 114, 116) on the IC chip 102. As a result of this significant X-direction travel (e.g., generally illustrated by D1 and D2), different on-chip load-drawing components receiving power from a same VRM may receive power from the VRM along current paths of different length. Due to impedance differences along these two variable-length paths, voltage droop may be experienced at the on-chip load-drawing components that are further away from the VRM block. If, for example, both of the on-chip load-drawing components 114 and 116 are expecting a voltage of 0.8V, it is possible that the component 114 may receive the full 0.8V while the component receives 0.7V.

To ensure the component 116 does not experience performance problems due to the voltage droop, traditional systems may incorporate one or more decoupling capacitors in close proximity to the on-chip load-drawing component 116 such that a voltage drop of predetermined magnitude may cause a resulting current discharge from the decoupling capacitor(s). Provided that the capacitance is large enough, this resulting current discharge may suffice to allow the component 116 to operate without performance degradation for a period of time while the corresponding VRM utilizes a feedback loop (e.g., a reference voltage) to adjust a set-point and ramp-up voltage at the component 116 to the actually expected voltage level.

In contrast to this traditional solution with the VRM block being offset from the chip package 104 in the X-Y plane (e.g., at the position 118), the herein proposed designs provide for placement of one or more VRM blocks (e.g., the VRM blocks 112, 120) on top of the chip package 104 such that each one of the VRM blocks 112, 120 is aligned along a Z-axis (e.g., a Z-axis perpendicular to the PCB 110, as shown), with the chip package 104 and/or with the specific load-drawing components within the IC chip package 104 that receive power from that particular VRM block.

The one or more VRM blocks 112, 120 are each connected to their respective load-drawing components of the IC chip 102 through the electrical connections exposed on the upward-facing surface 128 of the chip package 104. As a consequence of this configuration, all load-drawing components that receive power from a same VRM block may be positioned at equal or substantially equal (e.g., +/−5%) distances from the feed output of that VRM block such that voltage droop is not observed between those load-drawing components. For example, the on-chip load-drawing components 114 and 116 may be positioned on the IC chip 102 at equal distances from their respective voltage source (e.g., a VRM power output VRM block 112) such that they both receive equal power at any given time. Additionally, these power connections through the upward-facing surface 128 of the chip package 104 allow for a reduction in the length of power lines between the IC chip 102 and the VRM blocks 112, 120, increasing the speed of power delivery to chip components as compared to traditional systems.

Figure 2:
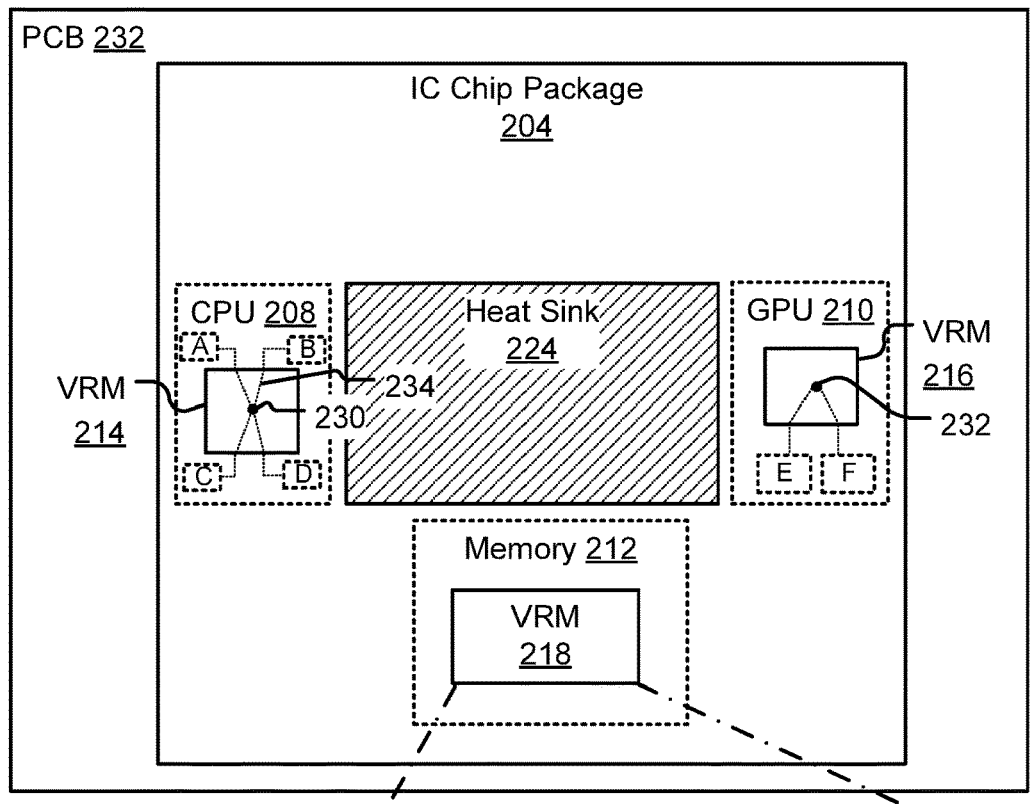
FIG. 2 illustrates a top-down view of an example IC chip assembly that provides for symmetric power delivery to various load-drawing components on an IC chip.
Figure 2:
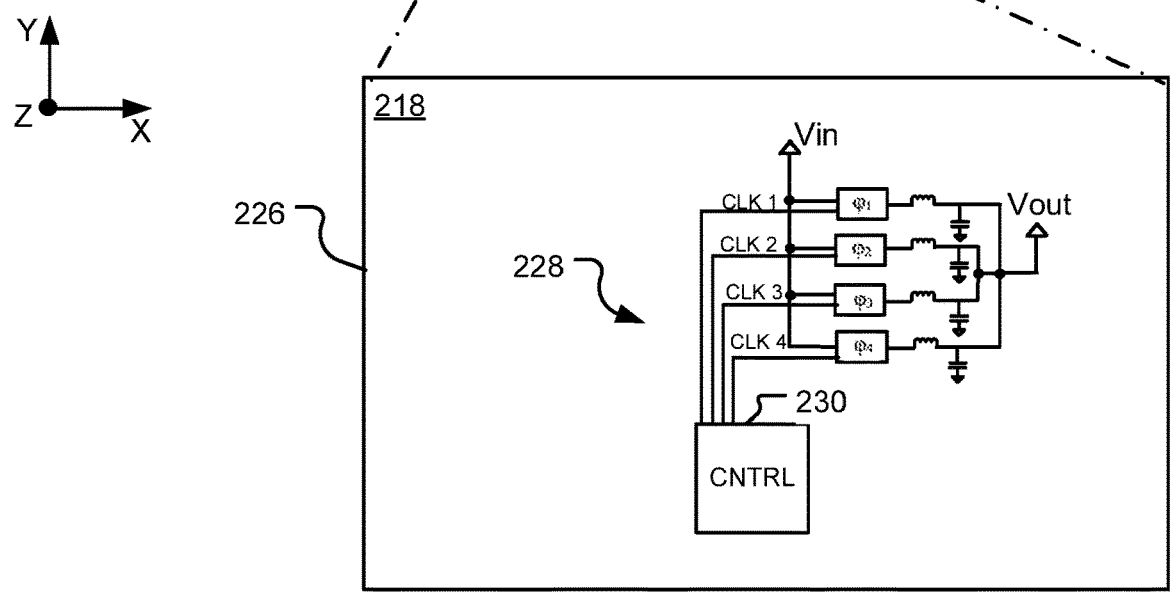

FIG. 2 illustrates a top-down view of an example IC chip assembly 200 that provides for symmetric power delivery to various on-chip load-drawing components. According to one implementation, the IC chip assembly 200 is the same or similar to the IC chip assembly 100 of FIG. 1. By example and without limitation, the IC chip assembly 200 includes an IC chip package 204 formed on a PCB 232. The IC chip package 204 encases an IC chip (e.g., an SoC chip, not shown) that supports various load-drawing electronics that may differ in various implementations. In FIG. 2, the IC chip is shown to include a CPU 208, a GPU 210, and a memory 212, In another implementation, the memory 212 is positioned on a device motherboard (e.g., separate from the IC chip package 204). In yet still another implementation, the IC chip package 204 includes a PHY chip. For example, a PHY chip on the IC chip package 204 may be utilized to communicate with memory positioned external to the IC chip package 204. A variety of other load-drawing components may similarly be included on the IC chip in different implementations.

Any of the power-drawings components (e.g., CPU 208, GPU 210, and memory 212) may include one or more separate power-drawing subsystems fed by a same VRM. To illustrate this concept, the CPU 208 is shown to include four example CPU subsystems A, B, C, and D that receive power from a VRM 214, while the GPU 210 is shown to include two example GPU subsystems E and F that receive power from a VRM 216. In FIG. 2, the dotted lines used for the power drawing components CPU 208, GPU 210, and memory 212 are intended to illustrates that these components are not visible due to the fact that they are embedded within the IC chip package 204.

The VRM 214 outputs power to the GPU 208 at a feed point 230, to which each of the GPU subsystems A, B, C, and D connect along power rails (e.g., a power rail 234) of substantially equal length so these subsystems do not experience voltage droop relative to one another. Likewise, the VRM 216 outputs power to the CPU 210 at a feed point 232, which is coupled to each of the CPU subsystems E and F along power rails of equal length. Due to this equidistant spacing from the corresponding VRM 216, subsystems E and F do not experience voltage droop relative to one another.

Further, the tight physical proximity between the VRMs 214, 216, 218 and the corresponding load-drawing components (e.g., via electrical connections that extend into the page along the Z-axis) significantly shortens the requisite length of each of the power rails between each VRM and its respective power-drawing components embedded in the IC chip package 204.

According to one implementation, the electrical connections between each of the VRM blocks 214, 216, and 218 and the corresponding on-chip load-drawing component (e.g., CPU 208, GPU 210, or memory 212) are formed through an upward-facing surface of the IC chip package 204 while I/O connections (e.g., HDMI, thunderbolt, USB) are formed through a downward-facing surface (not shown) of the IC chip package 204. A heat sink 224 is positioned on the IC chip package 204 and aligned along a Z-axis with a center of the IC chip. Notably, the heat sink 224 may assume a variety of shapes and sizes relative to the VRM blocks 214, 216, and 218. In one implementation, the heat sink 224 may cover as much as 90% of the surface area of the IC chip package 204. Thus, the illustrated sizes and positions of the heat sink 224 and the various VRM blocks 214, 216, 218 is intended as one non-limiting example.

By example and without limitation, exploded view 226 illustrates circuitry that may be included on the VRM block 218. Here, the VRM lock 218 supports a multi-phase VRM 228 that includes four phases ($\varphi_1$-$\varphi_4$) that, when combined, provide constant power to the memory 212. The multi-phase VRM 228 includes four parallel circuits that include an inductance component and a capacitance component. Each of these four parallel circuits handles a portion of the total current provided to the memory 212 (e.g., at Vout), commonly referred to as a phase. In different implementations, the multi-phase VRM 228 may assume of variety of different configurations and include any number of phases.

A voltage controller 230 controls the timing of the various phases for the VRM 228. In one implementation, each of the VRM blocks 214, 216 and 218 has its own voltage controller. In another implementation, the voltage controller 230 controls the timing of the various phases for the VRM 228 as well as for phases of various multi-VRMs on one or both of the other VRM blocks 214 and 216.

Figure 3:
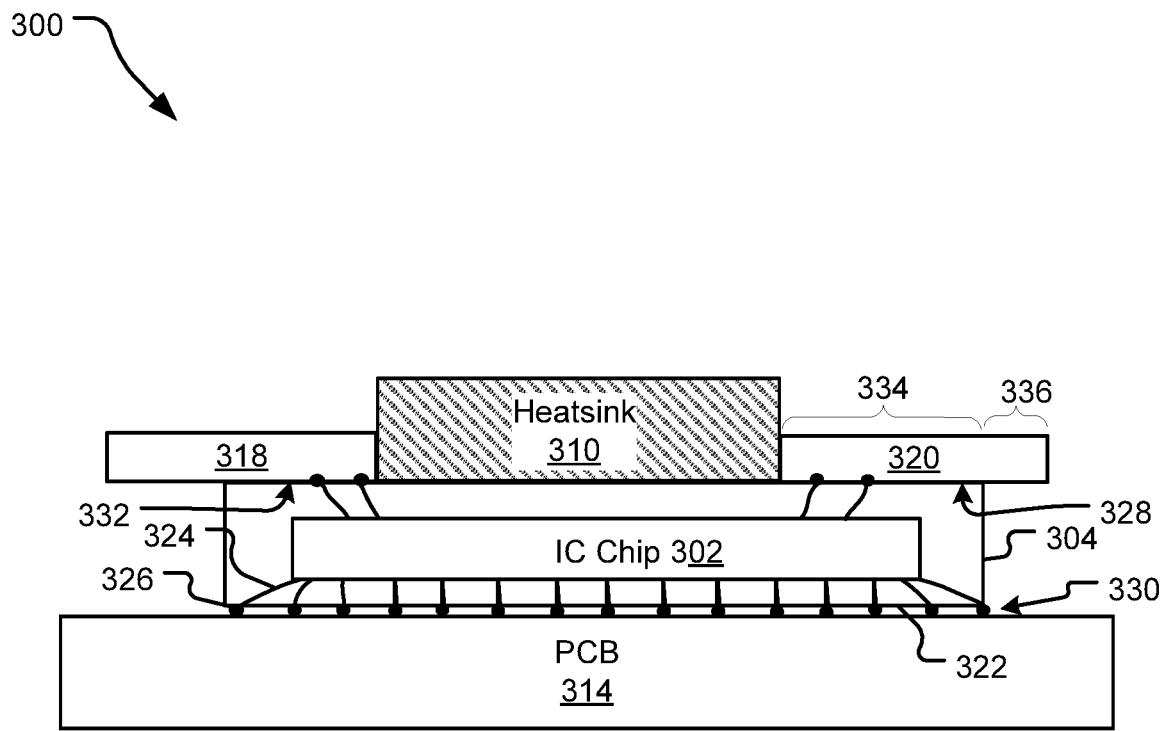
FIG. 3 illustrates a cross-sectional view of yet another IC assembly with features for symmetric power delivery.
Figure 3:
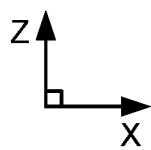

FIG. 3 illustrates a cross-sectional view of yet another integrated circuit (IC) assembly 300 with features for symmetric power delivery to multiple load-drawing components (not shown) on an IC chip 302.

The IC chip 302 is encased in a chip package 304 that includes traces (e.g., a trace 324) to connect electrical leads of various on-chip load-drawing components (not shown) to solder balls (e.g., a solder ball 326) included on one of two ball grid arrays (BGA 330, 332) included on opposing surfaces of the chip package 304.

Load-drawing electrical components on the IC chip 302 may each receive power along a rail supported by a corresponding VRM block 318 or 320. In contrast to the designs show in FIGS. 1-2, the VRM blocks 318 and 320 are shown to be elongated in the Y-Z plane and flattened along the Z-axis. Thus, the VRM blocks 318 and 320 have a first portion 334 in Z-direction alignment with the underlying chip package 304 and the second portion 336 that is not in Z-direction alignment (e.g., overhanging an outer edge of the chip package 304). The VRM blocks 318 and 320 are each axially aligned with the chip package 304 in the Z-direction (e.g., along an axis substantially perpendicular to the PCB). Like the design of FIG. 1-2, a heat sink 310 may be included on an upward facing surface 328 of the chip package 304 (e.g., the surface opposite a PCB 310) to draw heat away from the IC chip 302 and the VRM blocks 318 and 320.

Due to its decreased Z-direction thickness as compared to the chip designs of FIG. 1-2, the chip design of FIG. 3 may be well-suited for implementation in thinner devices.

Figure 4:
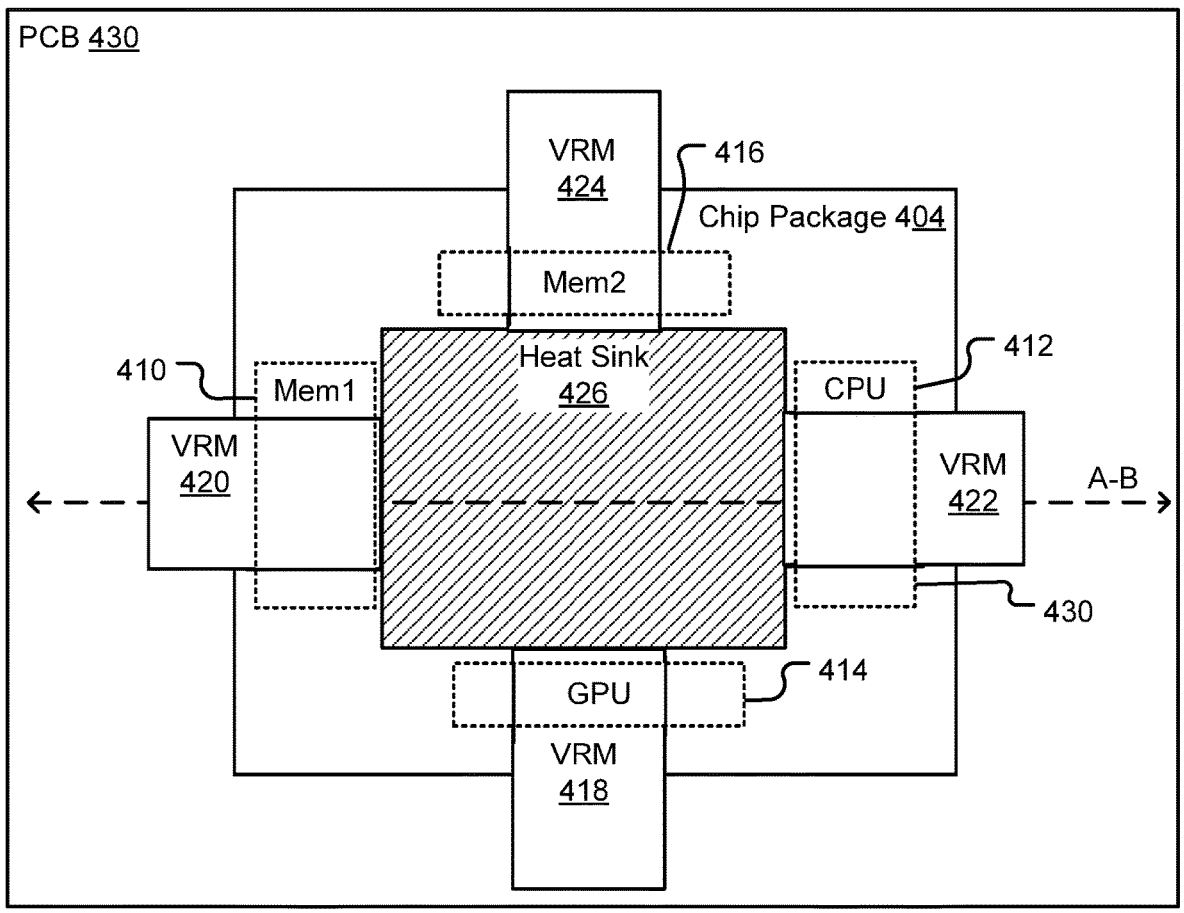
FIG. 4 illustrates a top-down view of yet another exemplary IC assembly with features for symmetric power delivery.
Figure 4:
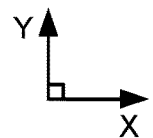

FIG. 4 illustrates a top-down view of an IC chip assembly 400 with features for symmetric power delivery. According to one implementation, a cross-section of the IC assembly 400 taken along line A-B looks the same or similar to the design shown in FIG. 3.

The IC chip assembly 400 includes an chip package 404 that encases an IC chip, such as an SoC (not shown). The IC chip supports various load-drawing electronics. By example and without limitation, the IC chip of FIG. 4 is shown to include a CPU 406, a GPU 408, and memories 410 and 412. Although these load-drawing electronics may be encased within the chip package 404, exemplary relative X-Y plane positions for these on-chip load-drawing components are shown in dotted lines.

The chip package 404 is shown coupled to four different VRM blocks 414, 416, 418, and 420 that are symmetrically arranged about a center of the IC chip. The IC chip assembly 400 includes a heat sink 426 which is, in one implementation, a vapor chamber heat sink. Each of the on-chip load-drawing components 410, 412, 414, and 416 is aligned along the z-axis within a corresponding one of the VRM blocks 418, 420, 422, and 424 and coupled to the respective VRM block via a power rail (not shown) that extends at least in part in the Z-direction. For example, the VRM block 422 has a Z-direction power rail that feeds the underlying (e.g., vertically-aligned) CPU 412; the VRM 418 has a Z-direction power rail that feeds the underlying GPU 414; the VRM 420 has a Z-direction power rail that feeds the underlying memory block 410; and the VRM 424 has a Z-direction power rail that feeds the underlying memory block 426. Vertical (z-direction) alignment of each VRM and its respective load-drawing components effectively shortens the electrical path of VRM power rails and also facilitates symmetrical arrangements of load-drawing components about a shared VRM feed to ensure equal power distribution to those components receiving power from a same VRM.

Although not specifically illustrated herein, other implementations of the disclosed technology may include greater or less than four VRM blocks positioned on top of the chip package 404 to provide power connections through the upward-facing surface while I/O connections for the chip are provided through the opposite, downward-facing surface (e.g., the surface facing the PCB 430). In yet another implementation, individual phases of a same multi-phase VRM are split between different voltage blocks.

Figure 5:
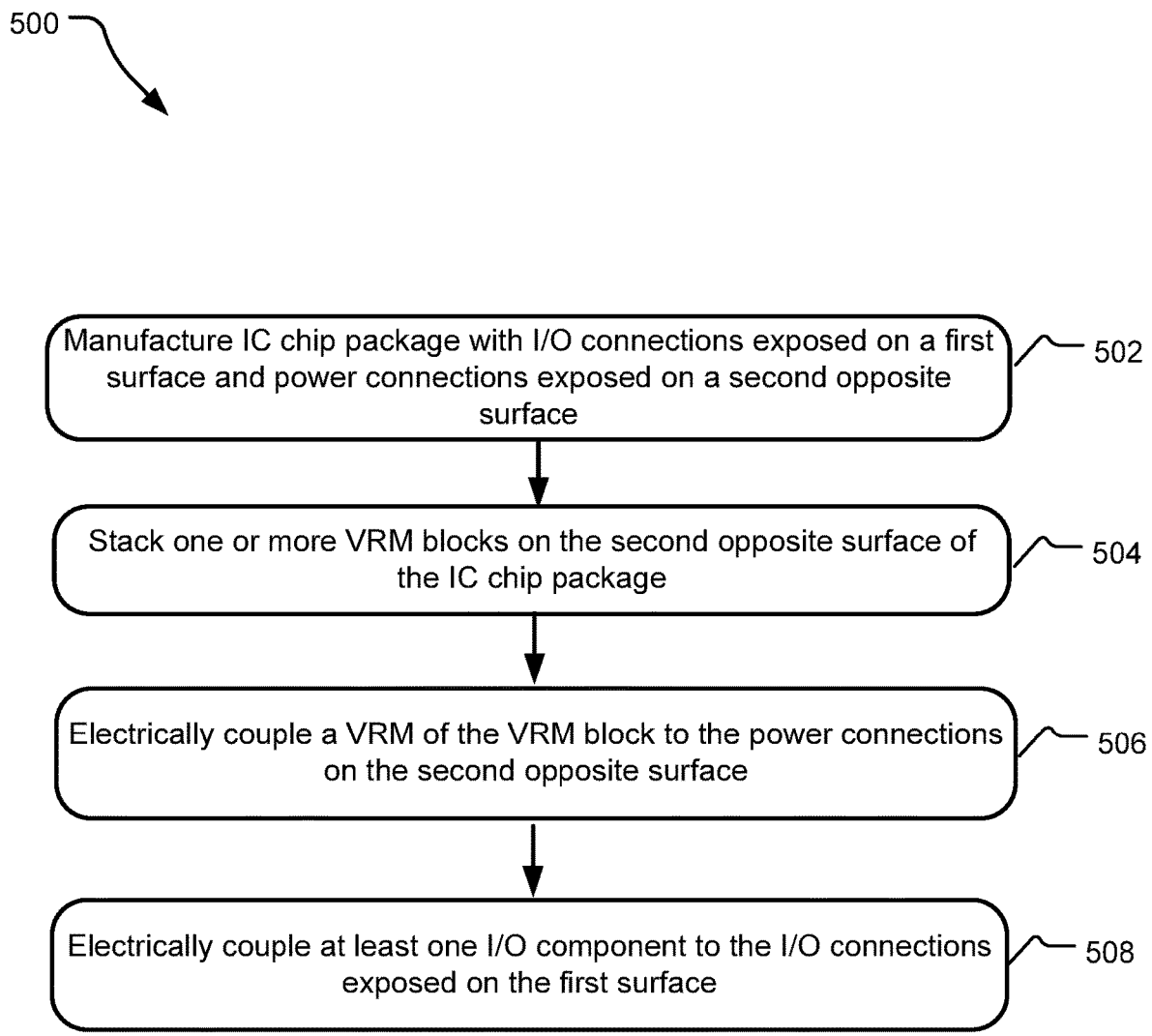
FIG. 5 illustrates example operations for building an IC chip assembly that provides symmetric power delivery to each of multiple on-chip load-drawing components.

FIG. 5 illustrates example operations 500 for building an IC chip assembly that provides symmetric power delivery to each of multiple on-chip load-drawing components receiving power from a same VRM. A chip manufacturing operation 502 manufactures an IC chip package (e.g., an SoC package) with I/O connections exposed on a first surface and power connections exposed on a second opposite surface. In one implementation, the electrical connections and I/O connections are each exposed by solder balls coupled to leads within the IC chip. For example, the IC chip package may include a first BGA on the first surface to provide the I/O connections (e.g., USB, HDMI, Thunderbolt, ethernet) and a second BGA on the second opposite surface to provide the power connections (e.g., power and ground) to each load-drawing on-chip component.

A positioning operation 504 positions a VRM block on the second opposite surface of the IC chip package. According to one implementation, the positioning operation 504 positions multiple VRM blocks on the second opposite surface such that each VRM block is substantially equidistant to a center of the IC chip encased within the chip package. In the same or another implementation, the positioning operation 504 positions multiple VRM blocks on the second opposite surface such that voltage rails between each VRM and load-drawing on-chip component are of substantially equal length.

A first coupling operation 506 electrically couples a VRM on the VRM block to the power connections (e.g., power and ground) on the second opposite surface and a second coupling operation 508 electrically couples one or more I/O components to a subset of the I/O connections exposed on the first surface.

An example system disclosed herein includes an integrated circuit (IC) chip package with I/O connections exposed on a first surface, power connections exposed on a second opposite surface, and at least one voltage regulation module (VRM) positioned on the second opposite surface and electrically coupled to the power connections on the second opposite surface.

In one example system according to any preceding system, the IC chip package includes two ball grid arrays (BGAs) on opposing surfaces, a first one of the BGAs providing the I/O connections and a second one of the BGAs providing the power connections.

In yet another example system of any preceding system, the at least one VRM is included on a VRM block coupled to the second opposite surface of the IC chip package.

In still another example system of any preceding system, the system further comprises multiple VRM blocks positioned on the first surface of the IC chip package, the multiple VRM blocks each including at least one VRM to provide power to a different on-chip load-drawing component.

In yet still another example system of any preceding system, the system further comprises a heat sink between the multiple VRM blocks on the IC chip package.

In still another example system of any preceding system, the IC chip package is a system on chip (SOC) package.

In yet still another example system of any preceding system, the IC chip package includes multiple load-drawing components powered by a common VRM on the IC chip package, each one of the multiple load-drawing components being physically offset from the common VRM by a substantially equal distance.

In yet still another example system of any preceding system, the at least one VRM is included on a VRM block that is positioned on the IC chip package and axially aligned with IC chip package along an axis substantially perpendicular to a PCB.

An example method disclosed herein includes forming an IC chip package with I/O connections exposed on a first surface and power connections exposed on a second opposite surface; positioning at least one voltage regulation module (VRM) on the second opposite surface and electrically coupling the VRM to the power connections the second opposite surface; and electrically coupling at least one I/O component to the I/O connections exposed on the second opposite surface.

In another example method of any preceding method, the IC chip package includes two ball grid arrays (BGAs) on opposing surfaces. A first one of the BGAs provides the I/O connections and a second one of the BGAs provides the power connections.

In yet still another example method of any preceding method, the at least one VRM is included on a VRM block couple to the first surface of the IC chip package.

Another example method of any preceding method further comprises positioning multiple VRM blocks on the second opposite surface of the IC chip package. The multiple VRM blocks each include at least one VRM to provide power to a different on-chip load-drawing component.

Still another example method of any preceding method further comprises attaching a heat sink between the multiple VRM blocks on the IC chip package.

In yet still another example method of any preceding method further the IC chip package is a system on chip (SOC) package.

In still yet another example method of any preceding method, the IC chip package includes multiple load-drawing components powered by a common VRM on the IC chip package, each one of the multiple load-drawing components being separated from the common VRM by a power rail of substantially equal length.

An example integrated circuit (IC) chip assembly comprises an IC chip package with I/O connections exposed on a first surface and power connections exposed on a second opposite surface, and multiple voltage regulation module (VRM) blocks positioned on the second opposite surface and providing power to the power connections on the second opposite surface, at least one of the multiple VRM blocks including a VRM that is vertically aligned with components in the IC chip package receiving power from the VRM.

In yet still another example IC chip assembly of any preceding chip assembly, wherein the IC chip package includes multiple load-drawing components each powered by a common VRM on the IC chip package, each one of the multiple load-drawing components being separated from the common VRM by a power rail of substantially equal length.

In still yet another example IC chip assembly of any preceding chip assembly, the IC chip package includes two ball grid arrays (BGAs) on opposing surfaces, a first one of the BGAs providing the I/O connections and a second one of the BGAs providing the power connections.

In another example IC chip assembly of any preceding chip assembly, each of the VRM blocks is aligned with IC chip package along an axis substantially perpendicular to a PCB.

In still another example IC chip assembly of any preceding chip assembly, the assembly further includes a heat sink between the multiple VRM blocks on the IC chip package.

An example method disclosed herein includes a means for forming an IC chip package with I/O connections exposed on a first surface and power connections exposed on a second opposite surface; a means for positioning at least one voltage regulation module (VRM) on the second opposite surface and electrically coupling the VRM to the power connections the second opposite surface; and a means for electrically coupling at least one I/O component to the I/O connections exposed on the second opposite surface.

The implementations described herein are implemented as logical steps in one or more computer systems. The logical operations may be implemented (1) as a sequence of processor-implemented steps executing in one or more computer systems and (2) as interconnected machine or circuit modules within one or more computer systems. The implementation is a matter of choice, dependent on the performance requirements of the computer system being utilized. Accordingly, the logical operations making up the implementations described herein are referred to variously as operations, steps, objects, or modules. Furthermore, it should be understood that logical operations may be performed in any order, unless explicitly claimed otherwise or a specific order is inherently necessitated by the claim language. The above specification, examples, and data, together with the attached appendices, provide a complete description of the structure and use of exemplary implementations.

What is claimed is:

1. A system comprising:
   an integrated circuit (IC) chip package with I/O connections exposed on a first surface and power connections exposed on a second opposite surface; and
   at least one voltage regulation module (VRM) positioned on the second opposite surface and electrically coupled to the power connections on the second opposite surface, the VRM being aligned along an axis perpendicular to the IC chip package with at least one load-drawing component within the IC chip package;
   a first electrical pathway that delivers power from the VRM to the at least one load-drawing component along a first length of the axis; and
   a second electrical pathway that transmits I/O data from the at least one load-drawing component and one or more of the I/O connections along a second length of the axis, the first length of the axis and the second length of the axis being mutually exclusive.

2. The system of claim 1, wherein the IC chip package includes two ball grid arrays (BGAs) on opposing surfaces, a first one of the BGAs providing the I/O connections and a second one of the BGAs providing the power connections.

3. The system of claim 1, wherein the at least one VRM is included on a VRM block coupled to the second opposite surface of the IC chip package.

4. The system of claim 3, wherein the system further comprises multiple VRM blocks positioned on the first surface of the IC chip package, the multiple VRM blocks each including at least one VRM to provide power to a different on-chip load-drawing component.

5. The system of claim 4, further comprising a heat sink between the multiple VRM blocks on the IC chip package.

6. The system of claim 3, wherein IC chip package is a system on chip (SoC) package.

7. The system of claim 1, wherein the IC chip package includes multiple load-drawing components each powered by a common VRM on the IC chip package, each one of the multiple load-drawing components being physically separated from the common VRM by a power rail of substantially equal length.

8. The system of claim 1, wherein the at least one VRM is included on a VRM block that is positioned on the IC chip package and axially aligned with IC chip package along an axis substantially perpendicular to a PCB.

9. A method comprising:
   forming an IC chip package with I/O connections exposed on a first surface and power connections exposed on a second opposite surface; and
   positioning at least one voltage regulation module (VRM) on the second opposite surface, the VRM being aligned with at least one load-drawing component within the IC chip package along an axis perpendicular to the IC chip package, the VRM delivering power the at least one load-drawing component along a first length of the axis; and
   electrically coupling at least one I/O component to the I/O connections exposed on the first surface, the I/O component configured to transmit I/O data to the least one load-drawing component along a second length of the axis, the first length of the axis and the second length of the axis being mutually exclusive.

10. The method of claim 9, wherein the IC chip package includes two ball grid arrays (BGAs) on opposing surfaces, a first one of the BGAs providing the I/O connections and a second one of the BGAs providing the power connections.

11. The method of claim 9, wherein the at least one VRM is included on a VRM block couple to the first surface of the IC chip package.

12. The method of claim 9, further comprising:
   positioning multiple VRM blocks on the second opposite surface of the IC chip package, the multiple VRM blocks each including at least one VRM to provide power to a different on-chip load-drawing component.

13. The method of claim 12, further comprising:
   attaching a heat sink between the multiple VRM blocks on the IC chip package.

14. The method of claim 12, wherein the IC chip package is a system on chip (SoC) package.

15. The method of claim 9, wherein the IC chip package includes multiple load-drawing components each powered by a common VRM on the IC chip package, each one of the multiple load-drawing components being separated from the common VRM by a power rail of substantially equal length.

16. An integrated circuit (IC) chip assembly comprising:
   an IC chip package with I/O connections exposed on a first surface and power connections exposed on a second opposite surface; and
   multiple voltage regulation module (VRM) blocks positioned on the second opposite surface and providing power to the power connections on the second opposite surface, at least one of the multiple VRM blocks including a VRM that is aligned with at least one load-drawing component within the IC chip package along an axis perpendicular to the IC chip package;
   a first electrical pathway that delivers power from the VRM to the at least one load-drawing component along a first length of the axis; and
   a second electrical pathway that transmits I/O data from the at least one load-drawing component and one or more of the I/O connections along a second length of the axis, the first length of the axis and the second length of the axis being mutually exclusive.

17. The IC chip assembly of claim 16, wherein the IC chip package includes multiple load-drawing components that are each powered by a common VRM on one of the VRM blocks, each one of the multiple load-drawing components being physically separated from the common VRM by a power rail of substantially equal length.

18. The IC chip assembly of claim 16, wherein the IC chip package includes two ball grid arrays (BGAs) on opposing surfaces, a first one of the BGAs providing the I/O connections and a second one of the BGAs providing the power connections.

19. The IC chip assembly of claim 16, wherein each of the VRM blocks is aligned with IC chip package along an axis substantially perpendicular to a PCB.

20. The IC chip assembly of claim 16, further comprising a heat sink between the multiple VRM blocks on the IC chip package.

* * * * *